(12) United States Patent
Zhou

(10) Patent No.: US 11,440,313 B2
(45) Date of Patent: Sep. 13, 2022

(54) VACUUM WIPER AND STENCIL PRINTER WITH VACUUM WIPER

(71) Applicant: Illinois Tool Works Inc., Glenview, IL (US)

(72) Inventor: Ranjie Zhou, Jiangsu (CN)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 17/420,340

(22) PCT Filed: Jan. 3, 2020

(86) PCT No.: PCT/US2020/012178
§ 371 (c)(1),
(2) Date: Jul. 1, 2021

(87) PCT Pub. No.: WO2020/142684
PCT Pub. Date: Jul. 9, 2020

(65) Prior Publication Data
US 2022/0088917 A1    Mar. 24, 2022

(30) Foreign Application Priority Data

Jan. 4, 2019   (CN) .......................... 201920015620.0

(51) Int. Cl.
*B41F 15/08*     (2006.01)
*B41F 35/00*     (2006.01)
*H05K 3/12*      (2006.01)

(52) U.S. Cl.
CPC ........ *B41F 15/0881* (2013.01); *B41F 35/005* (2013.01); *H05K 3/1233* (2013.01);
(Continued)

(58) Field of Classification Search
CPC ............. B41P 2215/50; B41P 2235/24; H05K 2203/085
See application file for complete search history.

(56) References Cited

U.S. PATENT DOCUMENTS 7,040,228 B2    5/2006   Perault et al.

FOREIGN PATENT DOCUMENTS

CN       1939717 A     4/2007
CN     104228317 A    12/2014
(Continued)

OTHER PUBLICATIONS

Int'l Search Report and Written Opinion Appln No. PCT/US2020/012178 dated Mar. 30, 2020.
(Continued)

*Primary Examiner* — Matthew G Marini
*Assistant Examiner* — Marissa Ferguson-Samreth
(74) *Attorney, Agent, or Firm* — Lando & Anastasi, LLP

(57) ABSTRACT

A vacuum wiper, comprising a housing, a connection port, multiple holes and a hole adjusting means; the housing contains a cavity; the connection port is disposed on the housing and is in communication with the cavity; the multiple holes are disposed on the housing in the length direction of the housing, such that the cavity of the vacuum wiper housing is able to be in fluid communication with the outside via the multiple holes. The vacuum wiper has a maximum vacuumizing length when all of the multiple holes are in communication with the outside. The hole adjusting means is configured to be capable of blocking one or more of the multiple holes in sequence from two ends in the length direction of arrangement of the multiple holes of the vacuum wiper, such that the vacuum wiper is able to adjust the vacuumizing length. The provision of the hole adjusting means enables the vacuum wiping apparatus to have an adjustable vacuumizing length, in order to match the wiping of stencils with different length specifications, thereby effectively increasing the vacuumizing efficiency of the vacuum wiping apparatus and reducing the production cost.

19 Claims, 12 Drawing Sheets

(52) U.S. Cl.
CPC ....... *B41P 2215/50* (2013.01); *B41P 2235/24* (2013.01); *H05K 2203/085* (2013.01)

(56) References Cited

FOREIGN PATENT DOCUMENTS

| | | | | |
|---|---|---|---|---|
| CN | 206568777 U | * | 10/2017 | |
| CN | 107379739 A | | 11/2017 | |
| CN | 108501509 A | | 9/2018 | |
| DE | 102007047554 | | 9/2007 | |
| DE | 102007047554 B3 | * | 1/2009 | ............... B08B 5/02 |
| EP | 0838979 | | 4/1998 | |
| EP | 838979 A1 | * | 4/1998 | ............ B41F 35/005 |
| KR | 20060127261 A | * | 12/2006 | .............. B41F 35/00 |

OTHER PUBLICATIONS

Taiwan Search Report from corresponding Taiwan Application No. 108137434 dated Jun. 9, 2022.

* cited by examiner

VACUUM WIPER AND STENCIL PRINTER WITH VACUUM WIPER

RELATED APPLICATIONS

This application is filed as a national stage application under 35 U.S.C. 371 from PCT international application number PCT/US2020/012178, filed Jan. 3, 2020, which claims priority to Chinese Patent Application No. 201920015620.0, filed Jan. 4, 2019, entitled "VACUUM WIPER AND STENCIL PRINTER WITH VACUUM WIPER." The entireties of PCT international application number PCT/US2020/012178 and Chinese Patent Application No. 201920015620.0 are incorporated herein by reference.

TECHNICAL FIELD

The present application relates to the technical field of stencil printers, in particular to a vacuum wiper for cleaning a stencil or steel mesh in a stencil printer.

BACKGROUND ART

A stencil printer generally uses a hollowed-out stencil or steel mesh to print solder paste onto a substrate such as a printed circuit board (PCB). In a printed circuit board (PCB) printing process, first of all, the positions of hollowed-out holes in the stencil or steel mesh are aligned with the positions of elements to be affixed to the printed circuit board (PCB), then a squeegee is used to cause the solder paste to pass through the hollowed-out holes in the stencil or steel mesh and be distributed at the positions of the elements to be affixed to the printed circuit board (PCB). In the process of the solder paste being distributed onto the printed circuit board (PCB) through the stencil or steel mesh by the squeegee, a small amount of solder paste will often remain on the stencil or steel mesh. In the prior art, a vacuum wiper is often used to clean away the solder paste remaining on the stencil or steel mesh.

Due to the fact that printed circuit boards (PCBs) have different length specifications, stencils or steel meshes in stencil printers also have different length specifications, in order to match printed circuit boards (PCBs) with different length specifications to print solder paste. When a vacuum wiper is used to clean away solder paste remaining on a stencil or steel mesh, one vacuum wiper of fixed length will struggle to meet the cleaning requirements of multiple stencils or steel meshes with different length specifications.

SUMMARY

One object of the present application is to provide an improved vacuum wiper, which is capable of adapting to PCBs with different length specifications, while meeting the wiping requirements of stencils or steel meshes with different length specifications.

In order to achieve the abovementioned objective, a first aspect of the present application is the provision of a vacuum wiper, comprising a housing, a connection port, multiple holes and a hole adjusting means; the housing contains a cavity; the connection port is disposed on the housing and is in communication with the cavity; the multiple holes are disposed on the housing in the length direction of the housing, and the multiple holes are able to establish fluid communication between the cavity and the outside; the vacuum wiper has a maximum vacuumizing length when all of the multiple holes are in communication with the outside; the hole adjusting means is configured to be capable of blocking one or more of the multiple holes in sequence from two ends in the length direction of arrangement of the multiple holes of the vacuum wiper, such that the vacuum wiper is able to adjust the vacuumizing length.

In the vacuum wiper described above, the connection port is connectable to a vacuumizing apparatus.

In the vacuum wiper described above, the hole adjusting means is multiple plugs, the size of each of the multiple plugs being matched to one corresponding hole of the multiple holes, thereby enabling said each plug to be at least partially plugged into one hole matched thereto.

In the vacuum wiper described above, the multiple plugs are made of an elastic material.

In the vacuum wiper described above, the material of the multiple plugs is silicone rubber.

In the vacuum wiper described above, each of the multiple plugs has a plug-in part and a handle part, the plug-in part and the handle part being configured such that: when the plug is plugged into one hole matched thereto, the plug-in part enters the hole completely, and the handle part is retained outside the hole.

In the vacuum wiper described above, the hole adjusting means is two sliders, the two sliders being disposed at left and right sides of the housing respectively, such that the two sliders are able to slidably block one or more of the multiple holes.

In the vacuum wiper described above, each of the two sliders has a body part and a protrusion, the body part being configured to adjustably cover one or more of the multiple holes from above, and the protrusion being configured to facilitate manual adjustment by an operator, so as to control the number of blocked holes.

In the vacuum wiper described above, one end of each of the two sliders is connected to an electric motor, such that the two sliders are both driven by the electric motor, in order to control the number of blocked holes.

In the vacuum wiper described above, the vacuum wiper further comprises a through-groove, the through-groove being disposed on an upper surface of the housing and located above the multiple holes, the through-groove being configured such that the two sliders are able to slide in the through-groove, and the two sliders are able to slidably cover the multiple holes from above.

A second aspect of the present application is the provision of a stencil printer, comprising: a support platform, any one of the vacuum wipers described above in the present application, a stencil, a wiping paper roller and a vacuumizing apparatus; the support platform is used for bearing a printed circuit board to be processed; the vacuum wiper is disposed at one side of the support platform; the stencil is movably disposed above the support platform and the vacuum wiper, the stencil being used for distributing solder paste onto the printed circuit board; wiping paper or wiping cloth can be wound on the winding roller such that the wiping paper or wiping cloth is able to cover the holes of the vacuum wiper from above; the vacuumizing apparatus is connected to the connection port of the vacuum wiper and configured to vacuumize the cavity of the vacuum wiper, such that solder paste on the stencil can be adhesively sucked by the wiping paper or wiping cloth above the vacuum wiper.

The hole adjusting means is disposed on the vacuum wiper of the present application, for the purpose of adjustably blocking fluid communication between the outside and the holes located at two ends in the length direction of the vacuum wiper, such that the vacuum wiper is able to adjust its vacuumizing length, in order to match the wiping requirements of stencils or steel meshes with different length specifications. The structure described above effectively increases the vacuumizing efficiency, saving wiping paper and reducing the cost of wiping.

DETAILED DESCRIPTION

Figure 1:
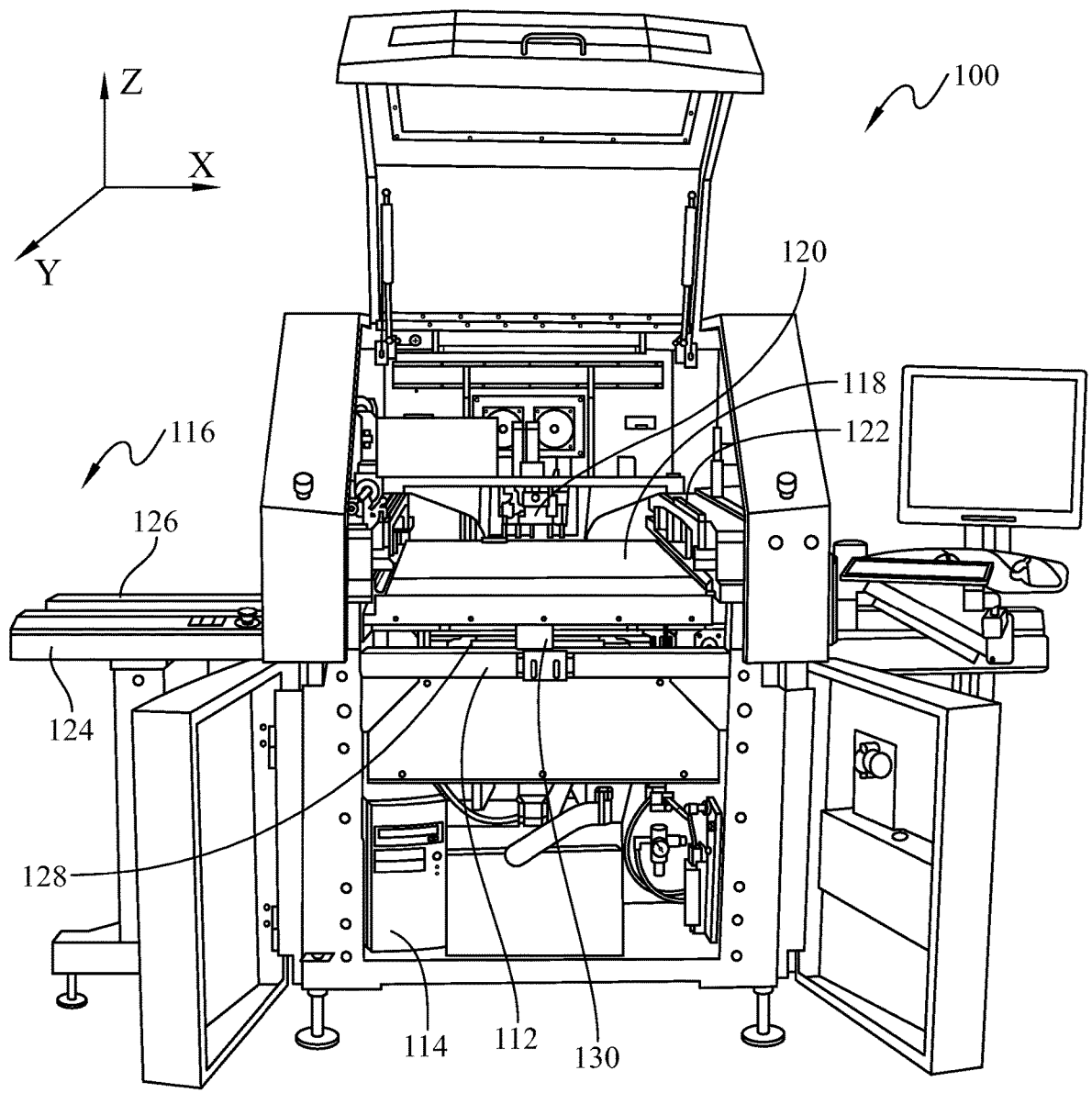
FIG. 1 is a three-dimensional front view of a stencil printer 100 according to an embodiment of the present application.

Various particular embodiments of the present application are described below with reference to the accompanying drawings, which form part of this Description. It should be understood that although terms indicating direction, such as "front", "rear", "up", "down", "left" and "right", etc., are used in the present application to describe various demonstrative structural parts and elements of the present application, these terms are used here purely in order to facilitate explanation, and are determined on the basis of demonstrative orientations shown in the drawings. Since the embodiments disclosed in the present application may be arranged in accordance with different directions, these terms indicating direction are purely illustrative, and should not be regarded as limiting. Where possible, identical or similar reference labels used in the present application denote identical components. In addition, the terms "steel mesh" and "stencil" may be used alternately herein; these two terms are both used to describe an apparatus which defines a pattern to be printed onto a substrate (i.e. a PCB) in a stencil printer.

FIG. 1 is a three-dimensional front view of a stencil printer 100 according to an embodiment of the present application. As shown in FIG. 1, the stencil printer 100 comprises a frame 112, which is used to support components of the stencil printer 100. The components of the stencil printer 100 comprise: a controller 114, a PCB transmission apparatus 116, a support platform 128, a stencil 118, an imaging system 130 and a squeegee 120. The controller 114 is disposed below the frame 112, and can control movement positions and operating states of the PCB transmission apparatus 116, support platform 128, stencil 118, imaging system 130 and squeegee 120. The PCB transmission apparatus 116 comprises a pair of transmission tracks 124 and 126, for transporting a PCB to be printed to the support platform 128, and removing the PCB which has undergone printing from the support platform 128. The support platform 128 is used for bearing the PCB, to prevent bending or deformation of the PCB during a printing operation. Furthermore, the support platform 128 may also be used to elevate or lower the PCB borne thereby in a Z-axis direction, thereby being able to cause the PCB to be printed to ascend in a direction approaching the stencil 118, and being able to cause the PCB which has undergone printing to descend in a direction away from the stencil 118. The stencil 118 is movably disposed above the PCB transmission apparatus 116. The stencil 118 has hollowed-out holes, for defining the positions of solder paste printed onto the PCB. An alignment system 130 is disposed close to the stencil 118, for aligning the stencil 118 and the PCB to be printed. The squeegee 120 is disposed above the stencil 118, and arranged so as to extend in an X-axis direction. A pair of squeegee racks 122 are further disposed on the frame 112; the squeegee racks 122 are arranged symmetrically at two sides of the squeegee 120 respectively, and each squeegee rack 122 extends in a Y-axis direction, so that the squeegee 120 set up on the squeegee racks 122 can move in the Y-axis direction. The squeegee 120 can also move up and down in the Z-axis direction, thereby being able to descend into contact with the stencil 118 before printing, and ascend so as to move away from the stencil 118 when printing is finished.

With regard to the stencil printer 100, the process of printing the PCB is mainly as follows:

The controller 114 first of all controls the PCB transmission apparatus 116 to transport the PCB to be printed to the support platform 128 via the transmission tracks 124 and 126. The controller 114 then controls the alignment system 130 to align the PCB to be printed with the stencil 118. Once the PCB has been aligned with the stencil 118, the controller 114 controls the support platform 128 to ascend along the Z-axis, such that the PCB borne thereby moves upwards away from the transmission tracks 124 and 126 to a position that is very close to the stencil 118, or into contact with the stencil 118. The controller 114 then controls the squeegee 120 to move downwards along the Z-axis, into contact with the stencil 118. Once the squeegee 20 has reached a suitable position in the Z-axis direction, the controller 114 may further control the squeegee 120 to move in the Y-axis direction via the squeegee racks 122. Once the squeegee 120 has reached a suitable position in the Y-axis direction, the controller 114 controls the squeegee 120 to print solder paste onto the PCB through the holes in the stencil 118. Once printing of the PCB is finished, the controller 114 controls the squeegee 120 to move upwards along the Z-axis and thereby move away from the stencil 118. The controller 114 then controls the support platform 128 to descend along the Z-axis, such that the PCB borne thereby comes into contact with the transmission tracks 124 and 126. Once the PCB has been laid on the transmission tracks 124 and 126 completely, the controller 114 controls the PCB transmission apparatus 116 to send the PCB out of the stencil printer 100, thereby completing the process of printing one PCB, in preparation for printing the next PCB.

In the process of the solder paste being distributed onto the PCB from the stencil 118 by the squeegee 120, a trace amount of solder paste will often remain and collect on the stencil 118. This will cause many problems, e.g. solder paste unexpectedly appears in regions of the PCB where it should not appear, with the result that the PCB experiences problems due to short circuits during use. Furthermore, once hardened, the solder paste remaining on the stencil 118 will make the procedure of aligning the PCB with the stencil 118 complex, and will also block the hollowed-out holes in the stencil 118, obstructing the distribution of solder paste onto the PCB from the stencil 118. Thus, it is very necessary for solder paste remaining at the bottom of the stencil 118 to be removed.

Figure 2:
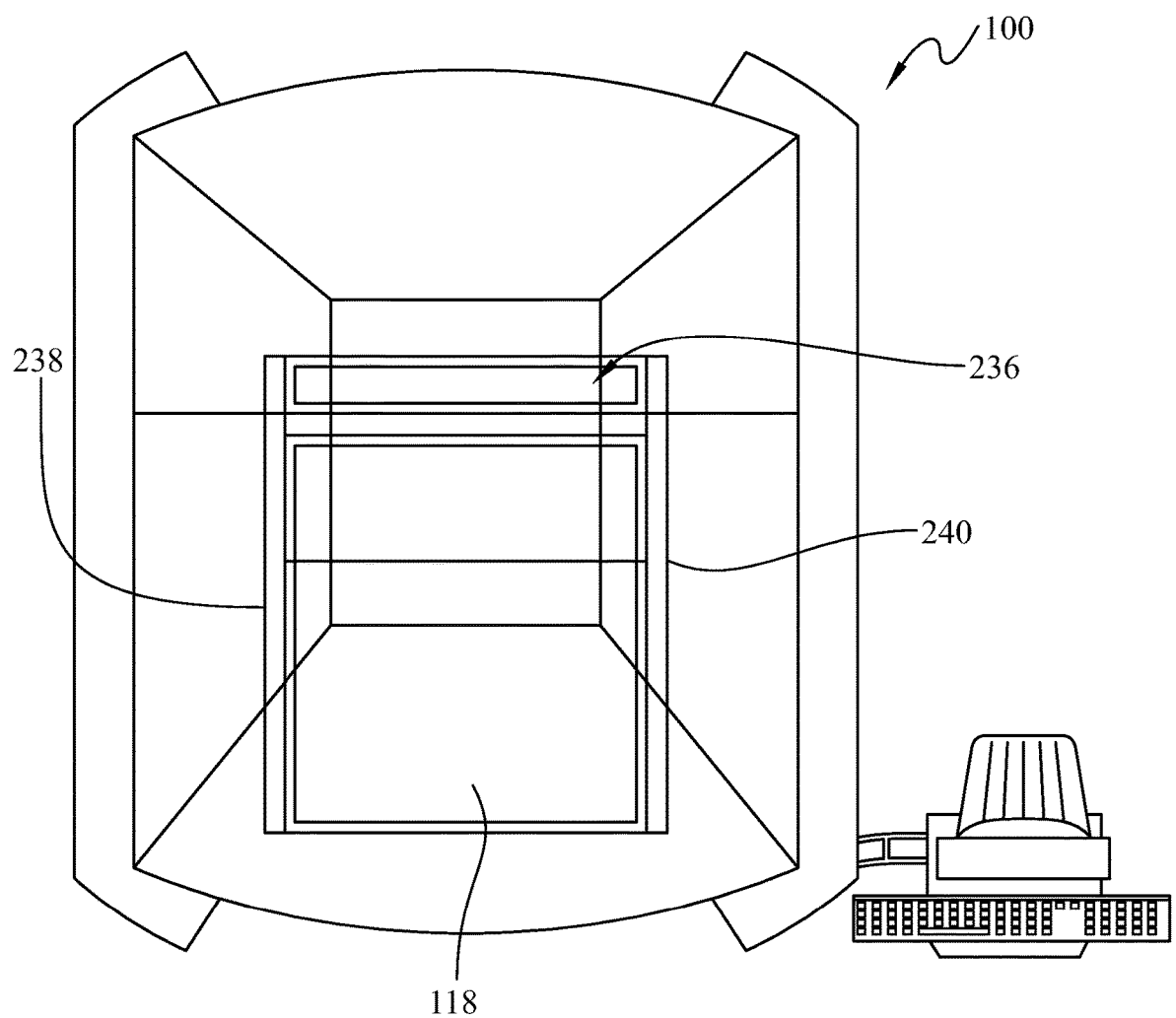
FIG. 2 is a top view of the stencil printer 100 shown in FIG. 1.

FIG. 2 is a top view of the stencil printer 100 shown in FIG. 1. A vacuum wiper assembly 236 is disposed at a rear side of the stencil printer 100, away from a PCB printing region, and is located at a rear side of the stencil 118. The stencil printer 100 is further provided with a pair of wiper assembly transportation guide rails 238 and 240, which are located at two sides of the vacuum wiper assembly 236 respectively, with the vacuum wiper assembly 236 being set up on the wiper assembly transportation guide rails 238 and 240. The arrangement described above enables the vacuum wiper assembly 236 to move to a region below the stencil 118 and reciprocate below the stencil 118 by means of a drive mechanism on the wiper assembly transportation guide rails 238 and 240. In other embodiments, it is also possible for the stencil 118 to be driven to move to a region above the vacuum wiper assembly 236, as long as the function of the vacuum wiper assembly 236 wiping a lower surface of the stencil 118 can be realized.

Figure 3:
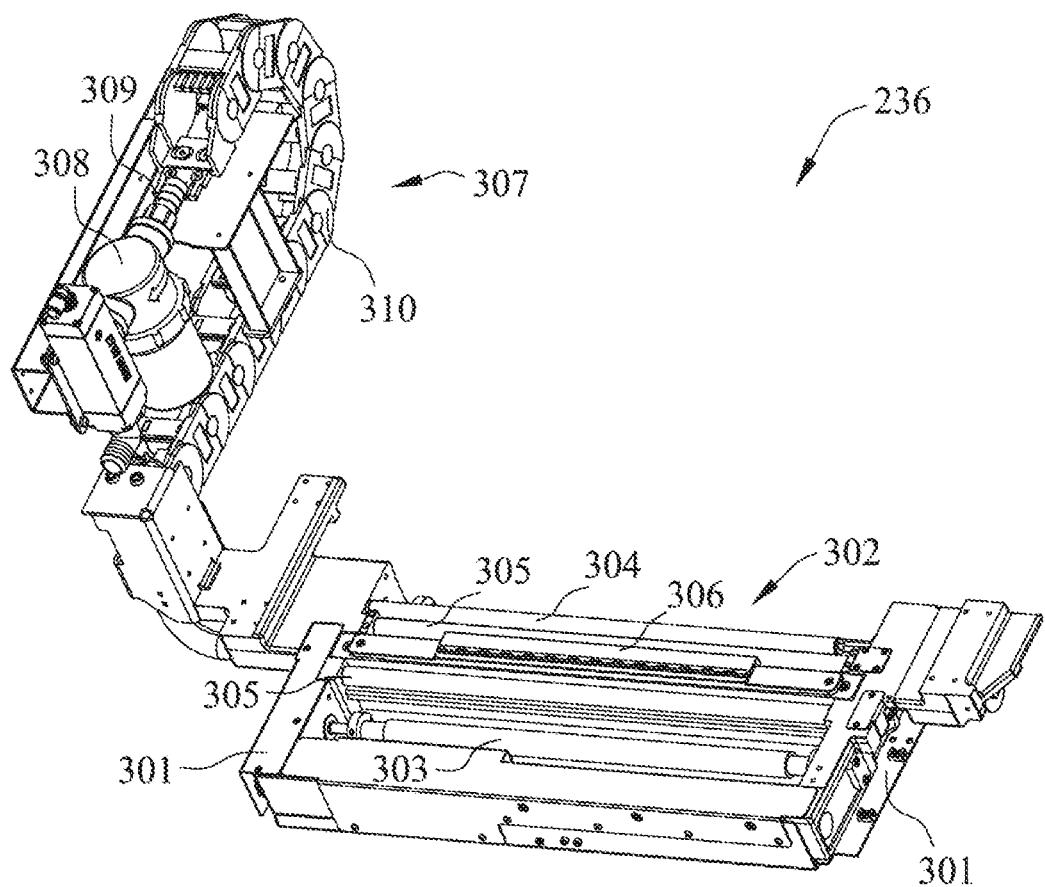
FIG. 3 is a three-dimensional view of a vacuum wiper assembly 236 shown in FIG. 2.

FIG. 3 is a three-dimensional view of the vacuum wiper assembly 236 shown in FIG. 2. As shown in FIG. 3, the vacuum wiper assembly 236 comprises supports 301 disposed at a left side and a right side. A pair of winding rollers 302 are set up on the supports 301; the winding rollers 302 comprise a feed roller 303 and a receiving roller 304, with a drive apparatus (not shown) being connected to the feed roller 303 and the receiving roller 304. Under the driving action of the drive apparatus, the feed roller 303 and the receiving roller 304 can rotate synchronously, being used to respectively feed and receive wiping paper. Multiple guide rollers 305 are provided between the feed roller 303 and the receiving roller 304, for guiding the transfer of the wiping paper. A vacuum wiper 306 is disposed between the multiple guide rollers 305. The guide rollers 305 and the vacuum wiper 306 are also all set up on the supports 301. A vacuumizing apparatus 307 is further disposed on the left-side support 301. The vacuumizing apparatus 307 comprises a vacuum pump 308, a connecting tube 309 and a drag chain 310. The drag chain 310 is disposed outside the connecting tube 309 in a surrounding manner, being used to protect the connecting tube 309. The connecting tube 309 is connected between the vacuum pump 308 and the vacuum wiper 306, thereby enabling the vacuum pump 308 to vacuumize the vacuum wiper 306. In an embodiment of the present application, wiping paper is wound on the winding rollers 302 for the purpose of wiping the stencil 118; in other embodiments, wiping cloth may be used instead of wiping paper.

Figure 4:
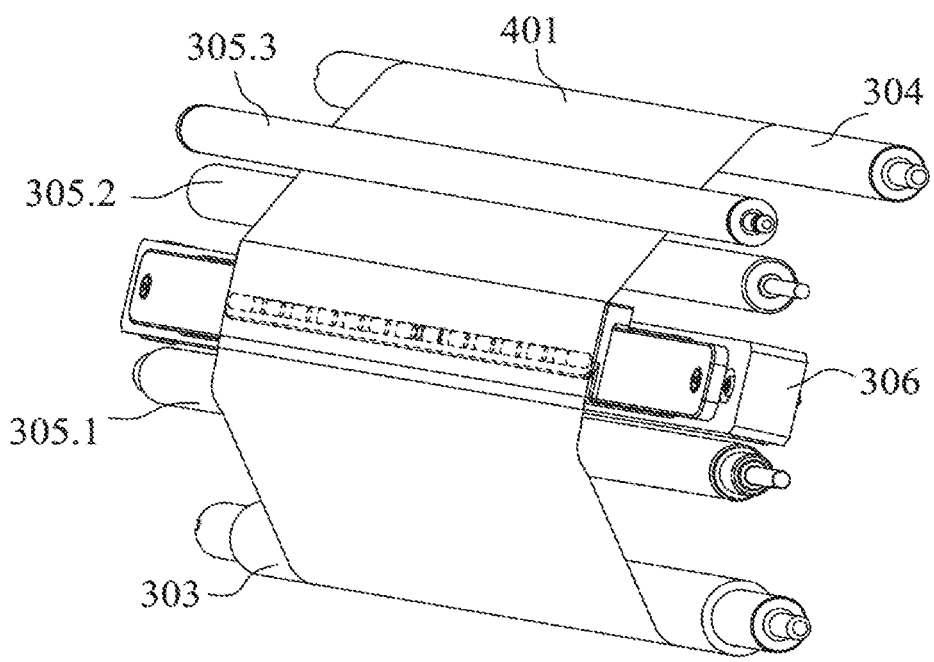
FIG. 4 is a schematic view of some of the components in the vacuum wiper assembly 236 shown in FIG. 3 in an operational state.

FIG. 4 is a schematic view of some of the components in the vacuum wiper assembly 236 in an operational state. As shown in FIG. 4, the guide rollers 305 comprise a first guide roller 305.1, a second guide roller 305.2 and a third guide roller 305.3. The first guide roller 305.1 is located between the feed roller 303 and the vacuum wiper 306; the second guide roller 305.2 and the third guide roller 305.3 are located between the receiving roller 304 and the vacuum wiper 306. A roll of wiping paper 401 is wound on the feed roller 303; as the feed roller 303 rotates, the wiping paper 401 wound on the feed roller 303 is transferred to an upper surface of the vacuum wiper 306. In the process of the wiping paper 401 being transferred from the feed roller 303 to the vacuum wiper 306, the first guide roller 305.1 serves the function of guiding and supporting the wiping paper 401. The wiping paper 401 located on the upper surface of the vacuum wiper 306 can serve a wiping function, and after wiping, continues to be transferred to the receiving roller 304 through a gap between the second guide roller 305.2 and the third guide roller 305.3. The receiving roller 304 rotates synchronously in cooperation with the feed roller 303, winding and collecting the wiping paper 401 which has performed a wiping action. The second guide roller 305.2 and the third guide roller 305.3 serve the functions of supporting and relatively fixing the wiping paper 401 between the vacuum wiper 306 and the receiving roller 304.

It can be seen by referring to FIG. 2 that during wiping, the upper surface of the vacuum wiper 306 is very close to the lower surface of the stencil 118, and the vacuum wiper assembly 236 can reciprocate on the wiper assembly transportation guide rails 238, 240, thereby enabling the wiping paper 401 located on the upper surface of the vacuum wiper 306 to repeatedly wipe the lower surface of the stencil 118.

Figure 5A:
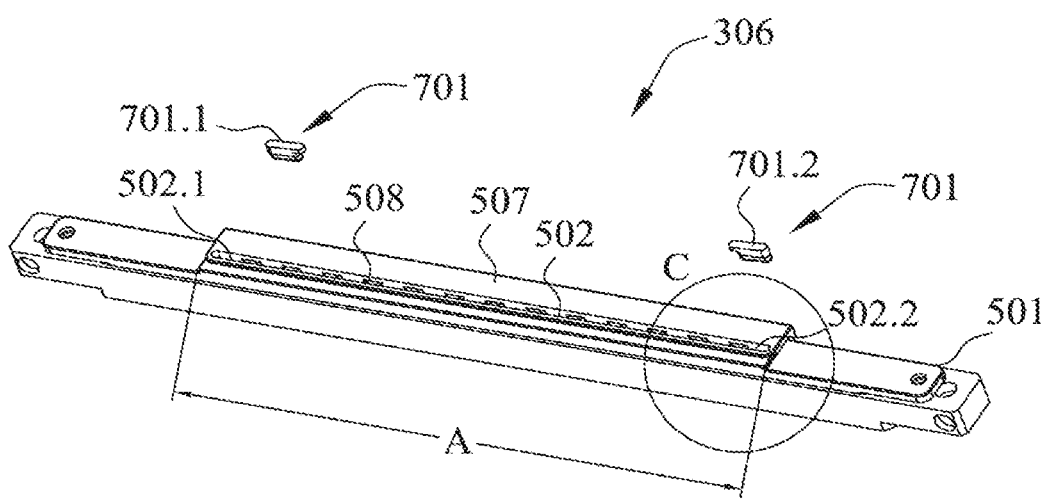
FIG. 5A is a partial exploded view of a vacuum wiper 306 in a first embodiment of the present application.
Figure 5B:
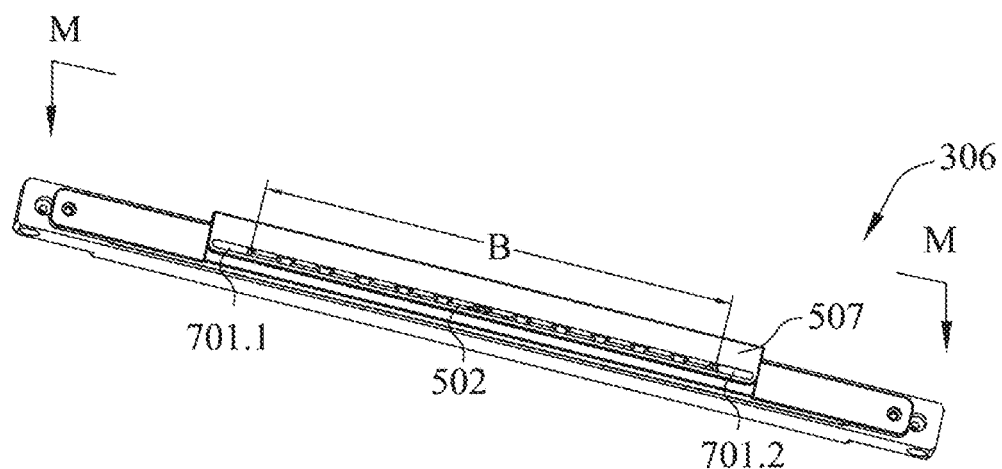
FIG. 5B is a three-dimensional schematic view of the vacuum wiper 306 shown in FIG. 5A.

FIG. 5A is a partial exploded view of the vacuum wiper 306 in a first embodiment of the present application; FIG. 5B is separately a three-dimensional schematic view of the vacuum wiper 306 shown in FIG. 5A. As shown in FIGS. 5A and 5B, the vacuum wiper 306 comprises a housing 501; the housing 501 substantially takes the form of a plate in the shape of a long strip. A protruding contact part 507 is provided in a middle position on an upper surface of the housing 501; the arrangement of the contact part 507 makes it easier for the upper surface of the vacuum wiper 306 to come close to a bottom face of the stencil 118. The contact part 507 has length A, and is provided with a groove 508 in the shape of a long strip along the entire length of the contact part 507. Multiple holes 502 are arranged in the groove 508 at intervals in the length direction; the holes 502 can be in communication with a cavity in the housing 501, thereby establishing fluid communication between the cavity in the housing 501 and the outside. The value of the entire length over which the holes 502 (capable of being in communication with the outside) are arranged on the contact part 507 of the vacuum wiper 306 is defined as the vacuumizing length. Within the range of the vacuumizing length, the vacuum wiper 306 can serve the function of cleaning the stencil 118 by adhesive suction with a vacuumizing effect. Since the holes 502 are arranged along the entire length A of the contact part 507, the vacuum wiper 306 has the maximum vacuumizing length of length A, and is thus able to adapt to the stencil 118 of length A at the most. However, in order to adapt to PCBs with different length specifications, the stencil 118 also has different length specifications. When the vacuum wiper 306 is used to wipe the stencil 118 of length less than A, holes at two ends of the contact part 507 do not serve the function of cleaning the stencil by adhesive suction; this not only wastes suction energy of the vacuum pump 308, but also results in the holes at a middle position of the contact part 507 being less effective at cleaning the bottom of the stencil 118 by adhesive suction.

In order to avoid the above problems, plugs 701 are used as hole adjusting means in the vacuum wiper 306 of the first embodiment of the present application. The plugs 701 comprise a first plug 701.1 and a second plug 701.2. The shape structure of the first plug 701.1 matches a first hole 502.1 at a leftmost end of the contact part 507, such that the first plug 701.1 can be plugged into the first hole 502.1; the shape structure of the second plug 701.2 matches a second hole 502.2 at a rightmost end of the contact part 507, such that the second plug 701.2 can be plugged into the second hole 502.2. In order to facilitate machining, the multiple holes 502 in the vacuum wiper 306 have the same shape and size, and the first plug 701.1 and second plug 701.2 also have exactly the same structure and shape.

When the first plug 701.1 and second plug 701.2 are plugged downwards into the first hole 502.1 and second hole 502.2 respectively from the positions shown in FIG. 5A, the vacuum wiper 306 shown in FIG. 5B can be obtained. As shown in FIG. 5B, the first plug 701.1 and second plug 701.2 cause the first hole 502.1 and second hole 502.2 respectively to not be in fluid communication with the outside; the length value of the holes 502 on the vacuum wiper 306 which are capable of being in communication with the outside is B, and so the vacuum wiper 306 has a vacuumizing length of length B, in order to adapt to the stencil 118 substantially of length B.

Figure 6A:
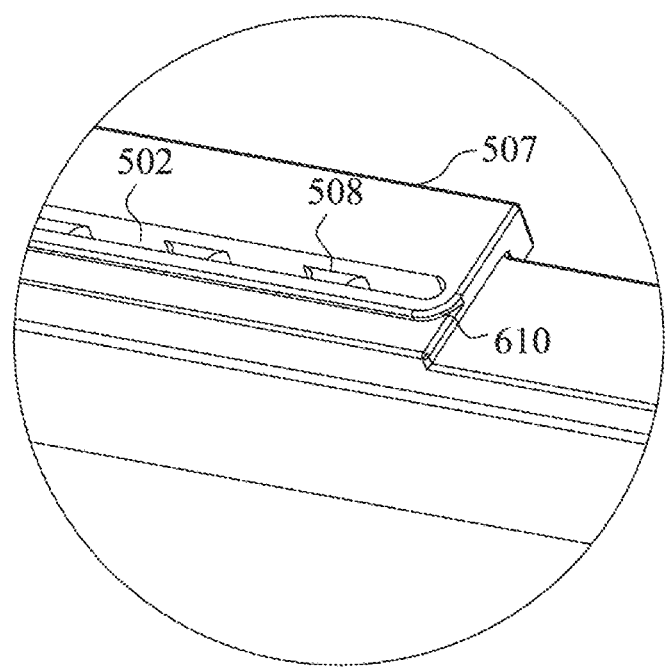
FIG. 6A is an enlarged view of a housing 501 shown in FIG. 5A at position C.
Figure 6B:
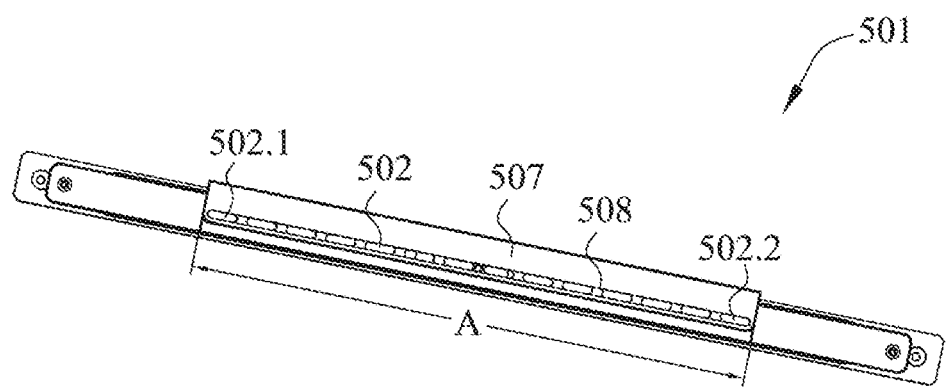
FIG. 6B is a top view of the housing 501 shown in FIG. 5A.
Figure 6C:
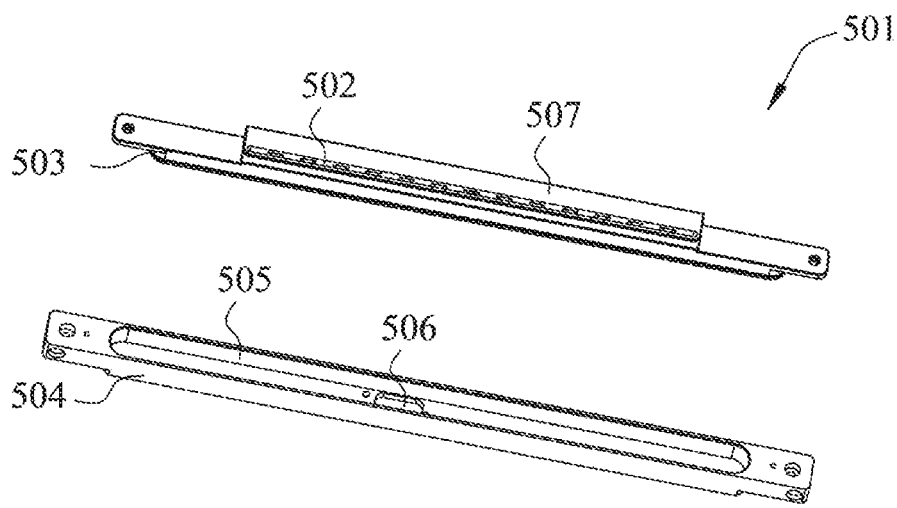
FIG. 6C is an exploded view of the housing 501 shown in FIG. 5A.

FIGS. 6A-6C show in greater detail the housing 501 of the vacuum wiper 306 shown in FIG. 5A, wherein FIG. 6A is an enlarged view of the housing 501 shown in FIG. 5A at position C. It can be seen by referring to FIGS. 5A and 6A that the multiple holes 502 are located at the bottom of the groove 508, and the multiple holes 502 run through downward from a bottom face of the groove 508. Thus, the multiple holes 502 are, on the whole, sunk into the groove 508. One side 610 of the contact part 507 in the width direction has a stepped form in two levels, wherein a step of each level extends in the length direction of the contact part 507, and the step located at an outer edge position of the contact part 507 is lower than the step located at a middle position of the contact part 507. The step of the higher level located at the middle position of the contact part 507 has chamfers at two ends in the length direction of the contact part 507.

FIG. 6B is a top view of the housing 501. As shown in FIG. 6B, the multiple holes 502 are of the same size, and are arranged at uniform intervals in a straight line. A cross section of each hole 502 has an elongated oval shape; a cross section of the elongated oval shape is specifically manifested as two ends in the length direction being arc-shaped and two sides in the width direction being parallel straight lines. The width of the groove 508 is the same as the width of the holes 502; two side edges of the groove 508 in the width direction coincide with two corresponding side edges respectively of the multiple holes 502, and are also two parallel straight lines. Two ends of the groove 508 in the length direction are also arc-shaped, wherein a left-end edge of the groove 508 coincides with a left-end edge of the first hole 502.1, and a right-end edge of the groove 508 coincides with a right-end edge of the second hole 502.2.

FIG. 6C is an exploded view of the housing 501. As shown in FIG. 6C, the housing 501 comprises an upper housing 503 and a lower housing 504; a lower part of the upper housing 503 and an upper part of the lower housing 504 both have an accommodating space, such that the vacuum wiper 306 contains a cavity 505 once the upper housing 503 and the lower housing 504 have been fitted and connected together. The contact part 507 is disposed on the upper housing 503; the holes 502 in the contact part 507 run through the upper housing 503 in a direction perpendicular to a surface of the contact part 507, thereby enabling the cavity 505 to be in fluid communication with the outside. A connection port 506 is disposed at the bottom of the lower housing 504, and used for connecting the connecting tube 309 of the vacuumizing apparatus 307. The connection port 506 is in communication with the cavity 505, thereby enabling the vacuum pump 308 to vacuumize the cavity 505 in the vacuum wiper 306 via the connecting tube 309. Under vacuumizing conditions of the vacuum pump 308, the cavity 505 in the vacuum wiper 306 is in a negative-pressure state, and the vacuum wiper 306 can produce an adhesive sucking effect on the bottom of the stencil 118 through the wiping paper 401 covering the upper surface of the vacuum wiper 306, thereby enhancing the wiping effect of the wiping paper 401, and helping to clean the stencil 118.

Figure 7:
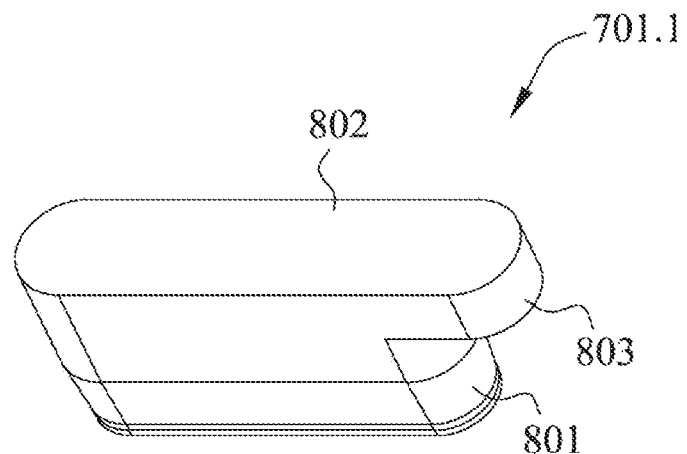
FIG. 7 shows a three-dimensional view of a first plug 701.1 shown in FIG. 5A.
Figure 8:
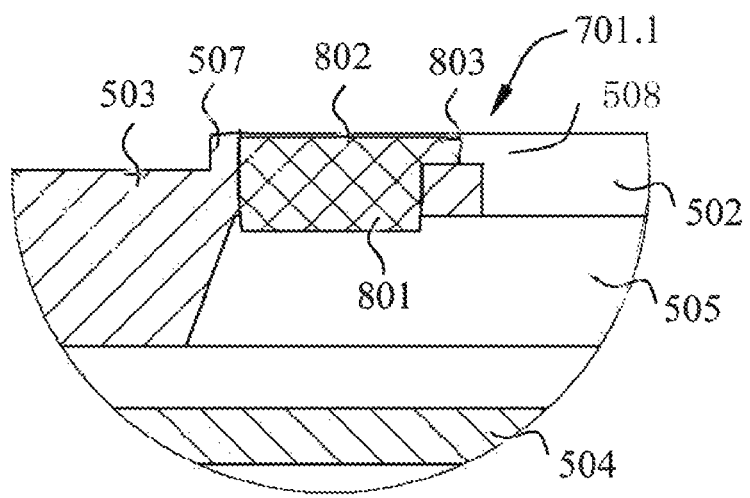
FIG. 8 shows a partial sectional view along line M-M of the vacuum wiper 306 shown in FIG. 5B at a position where the first plug 701.1 is installed.

FIG. 7 shows a three-dimensional view of the first plug 701.1 shown in FIG. 5A; FIG. 8 shows a sectional view along line M-M of the vacuum wiper 306 shown in FIG. 5B at a position where the first plug 701.1 is installed. Since the multiple holes 502 are of the same shape and size, the plugs 701 used to plug the holes 502 at other positions are of exactly the same shape structure and material as the first plug 701.1. As shown in FIGS. 7 and 8, the first plug 701.1 comprises a plug-in part 801 and a handle part 802. The plug-in part 801 is used for plugging into the hole 502, thus a cross-sectional shape of the plug-in part 801 matches a cross-sectional shape of the hole 502; since the cross section of the hole 502 in the vacuum wiper 306 has an elongated oval shape, the cross section of the plug-in part 801 also has an elongated oval shape. Furthermore, in order to achieve a sealed connection with the first hole 502.1 once the first plug 701.1 has been plugged in, and thereby avoid fluid communication between the first hole 502.1 and the outside, the first plug 701.1 may be made of an elastic material, the shape thereof being slightly larger than the shape of the first hole 502.1 matched thereto. In some embodiments, silicone rubber may be used to prepare the first plug 701.1. The handle part 802 is located above the plug-in part 801, and a cross section thereof also has an elongated oval shape. A left end of the handle part 802 and sides thereof at a middle position are flush with sides of the plug-in part 801; a right end of the handle part 802 protrudes relative to the plug-in part 801, thereby forming a boss 803.

As shown in FIG. 8, when the first plug 701.1 is plugged into the hole 502 at the leftmost end of the vacuum wiper 306, the plug-in part 801 is completely sunk into the hole 502, whereas the handle part 802 is retained outside the hole 502, and located in the groove 508 of the contact part 507. At this time, an upper surface of the first plug 701.1 is nearly flush with an upper surface of the contact part 507. The arrangement of the handle part 802 helps the first plug 701.1 plugged into the hole 502 to be pulled out smoothly, facilitating the adjustment of the vacuumizing length of the vacuum wiper 306.

It can be seen by referring to FIGS. 5A and 5B that when the plug 701 is plugged into the hole 502 located at the left side of the contact part 507, the boss 803 of the handle part 802 must face toward the right side of this hole 502; when the plug 701 is plugged into the hole 502 located at the right side of the contact part 507, the boss 803 of the handle part 802 must face toward the left side of this hole 502. The arrangement described above enables the plug-in part 801 and the handle part 802 of the plug 701 to be completely accommodated in the hole 502 and the groove 508 respectively.

In the embodiment shown in FIGS. 5A and 5B, the vacuum wiper 306 comprises two plugs 701. In other embodiments, the vacuum wiper 306 may also comprise another number of plugs, e.g. one, three, four, etc., with the size of each plug being matched to the size of the hole in which it is plugged, so that the hole is not in fluid communication with the outside; it is thereby possible to obtain vacuumizing lengths of other lengths less than A, in order to match stencils 118 with different length specifications. Furthermore, when plugged into the vacuum wiper 306, the plugs 701 must be plugged in symmetrically in sequence from the two ends of the vacuum wiper 306 respectively, so that the holes 502 containing no plugs are substantially concentrated in a middle region, making it easier to obtain a vacuumizing length located in the middle region; it is thereby possible to match vacuum wiping of the stencil 118 located above the middle region. When it is necessary to plug in an even number of plugs 701, all that need be done is to plug them in symmetrically in sequence from the left and right ends of the vacuum wiper 306 towards a middle position. When it is necessary to plug in an odd number of plugs 701, the plugs need only be plugged in in such a way that the vacuumizing length is substantially concentrated in a middle region. For example, when it is necessary to plug in one plug 701, this may be plugged into the first hole 701.1 at the leftmost end, or plugged into the second hole 701.2 at the rightmost end; when it is necessary to plug in three plugs 701, it is possible for two plugs be plugged in in sequence at the leftmost end of the vacuum wiper 306 and one plug to be plugged in at the rightmost end of the vacuum wiper 306, or possible for one plug to be plugged in at the leftmost end of the vacuum wiper 306 and two plugs to be plugged in in sequence at the rightmost end of the vacuum wiper 306.

In other embodiments, the cross section of the hole 502 may have other shapes, e.g. round, rectangular, etc., and the shape structure of the groove 508 may be adjusted according to the shape structure of the hole 502, as long as it is possible for multiple holes 502 to be sunk in the upper surface of the contact part 507, with all of the multiple holes 502 being exposed to the outside when in the state of having no hole adjusting means installed, enabling the cavity 505 to be in fluid communication with the outside. Furthermore, the sizes of the multiple holes 502 may also be set to be different from one another. In other embodiments in which the shape sizes of the multiple holes 502 are different, the multiple plugs 701 must also be correspondingly machined to have different shape structures, in order to match the multiple holes 502.

The first embodiment of the present application uses the plugs 701 as hole adjusting means; under conditions in which the vacuum wiper 306 has the maximum vacuumizing length A, a certain quantity of plugs 701 are plugged in symmetrically in sequence from the two ends of the vacuum wiper 306 as required, such that a middle position of the vacuum wiper 306 has an adjustable vacuumizing length, in order to adapt to the printing of PCBs with other length specifications less than A. The arrangement described above enables the vacuum wiper 306 to be adapted for the wiping and cleaning of stencils 118 with various length specifications matched to various PCBs, greatly increasing the vacuumizing efficiency of the vacuum wiper 306.

Apart from the plugs 701, the present application may also employ hole adjusting means with other structures, which are similarly able to serve the function of adjusting the vacuumizing length of the vacuum wiper 306.

Figure 9A:
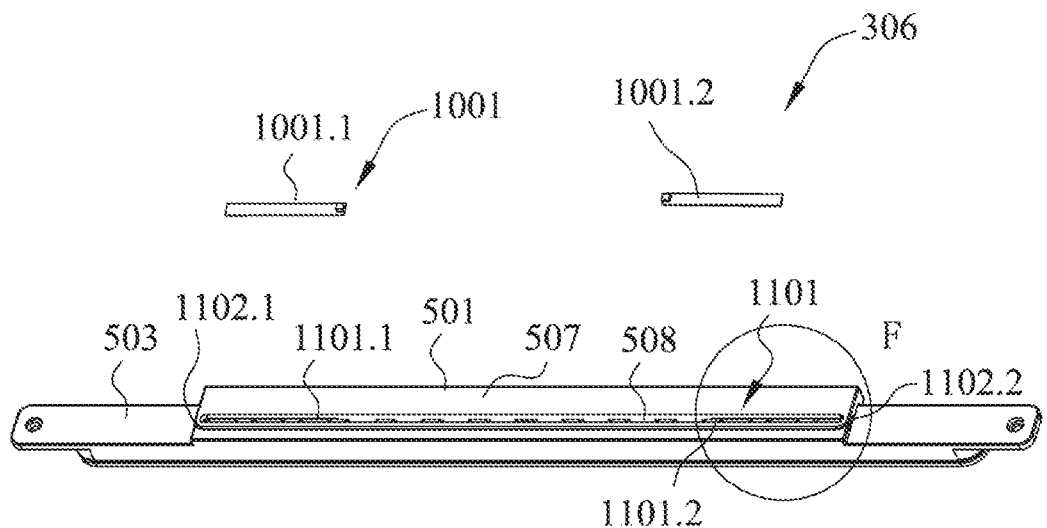
FIG. 9A is a partial exploded view of the vacuum wiper 306 in a second embodiment.
Figure 9B:
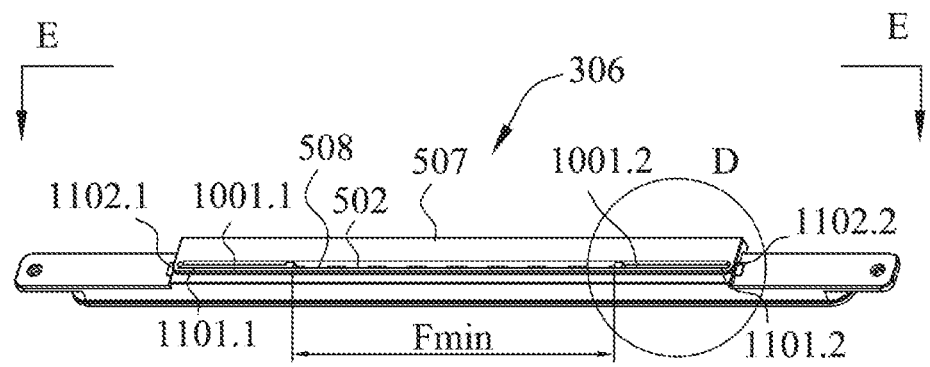
FIG. 9B is a three-dimensional view of the vacuum wiper 306 in the second embodiment.

FIGS. 9A and 9B show the vacuum wiper 306 in a second embodiment of the present application, wherein FIG. 9A is a partial exploded view of the vacuum wiper 306 in the second embodiment, and FIG. 9B is a three-dimensional view of the vacuum wiper 306 in the second embodiment. As shown in FIGS. 9A and 9B, the structure of the housing 501 of the vacuum wiper 306 in the second embodiment of the present application is similar to the structure of the housing 501 of the vacuum wiper 306 in the first embodiment. The difference is that through-grooves 1101 are further provided on the housing 501 of the second embodiment; the through-grooves 1101 comprise a first through-groove 1101.1 and a second through-groove 1101.2, located at the left and right ends of the contact part 507 respectively. The vacuum wiper 306 further comprises manual sliders 1001. The manual sliders 1001 comprise a first manual slider 1001.1 and a second manual slider 1001.2, the two manual sliders 1001 being exactly the same in structure and size.

When the first manual slider 1001.1 and the second manual slider 1001.2 are inserted downward from the positions shown in FIG. 9A into the first through-groove 1101.1 and the second through-groove 1101.2 at the left and right ends of the contact part 507 respectively, the vacuum wiper 306 shown in FIG. 9B can be obtained. As shown in FIG. 9B, the first manual slider 1001.1 and the second manual slider 1001.2 can slide in the first through-groove 1101.1 and the second through-groove 1101.2 respectively, and the first manual slider 1001.1 and the second manual slider 1001.2 cover the holes 502 at the left and right ends of the contact part 507 respectively from above, such that the vacuum wiper 306 has an adjustable vacuumizing length.

Figure 10:
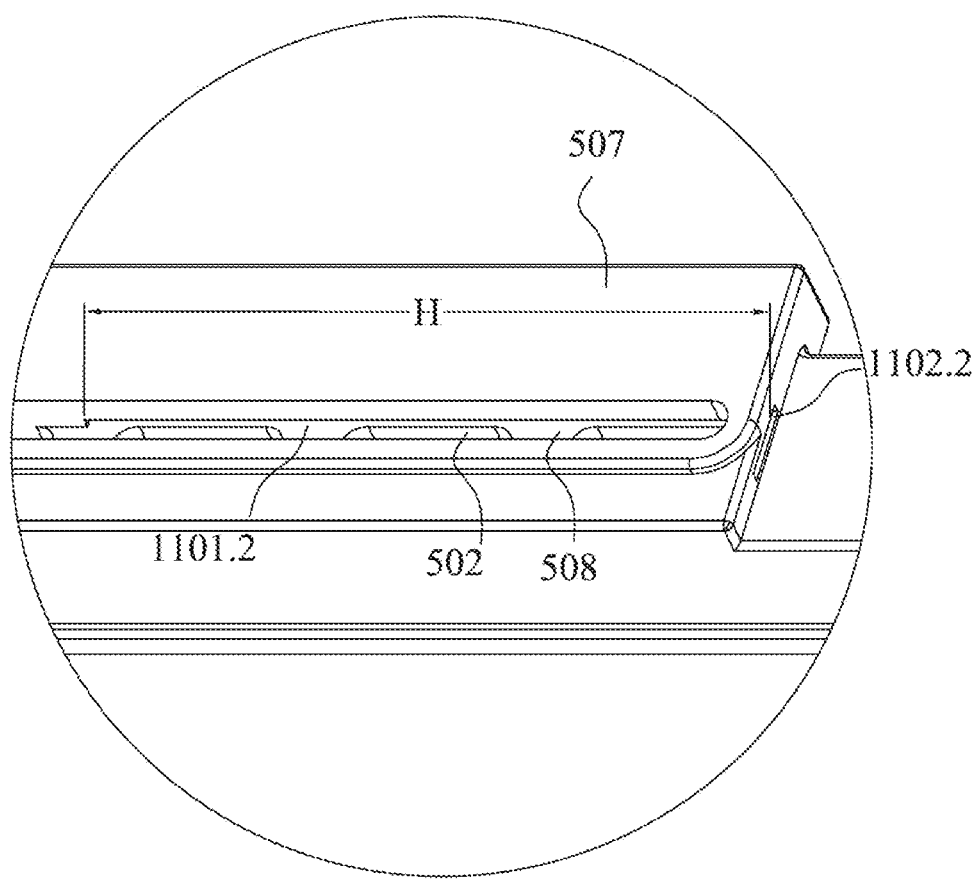
FIG. 10 shows an enlarged view of the housing 501 in FIG. 9A at position F.

FIG. 10 shows an enlarged view of the housing 501 in FIG. 9A at position F. Due to the fact that the left and right sides of the housing 501 have symmetrical structures, the structure of the right-side end of the contact part 507 is used as an example herein for the purposes of description. As shown in FIG. 10, the second through-groove 1101.2 is located at a bottom position at a right side of the groove 508, and extends in the length direction of the contact part 507 in the same manner as the groove 508. The second through-groove 1101.2 runs through the right-side end of the contact part 507, forming a second slot 1102.2, thereby enabling the second manual slider 1001.2 to be inserted into the second through-groove 1101.2 through the second slot 1102.2. A bottom face of the second through-groove 1101.2 and the bottom face of the groove 508 coincide, being located on the same plane, such that the second manual slider 1001.2 inserted into the second through-groove 1101.2 can cover the holes 502 located at the right end of the contact part 507. The second through-groove 1101.2 partially overlaps the groove 508. Specifically, the width of the second through-groove 1101.2 is greater than the width of the groove 508, such that the second through-groove 1101.2 extends further than the groove 508 toward the two sides of the contact part 507 in the width direction. Furthermore, the length H of the second through-groove 1101.2 is less than the length of the groove 508, such that the second manual slider 1001.2 inserted into the second through-groove 1101.2 can only cover some of the holes 502 at the rightmost end of the contact part 507. Due to the fact that the structures at the left and right sides of the vacuum wiper 306 are completely symmetrical, when the first manual slider 1001.1 and the second manual slider 1001.2 are completely inserted into the first through-groove 1101.1 and the second through-groove 1101.2 respectively by length H, as shown in FIG. 9B, the vacuum wiper 306 has the minimum vacuumizing length Fmin (see FIG. 9B). Thus, the length H of the first through-groove 1101.1 and the length H of the second through-groove 1101.2 can be determined according to the length of the stencil 118 with the minimum specifications.

Figure 11:
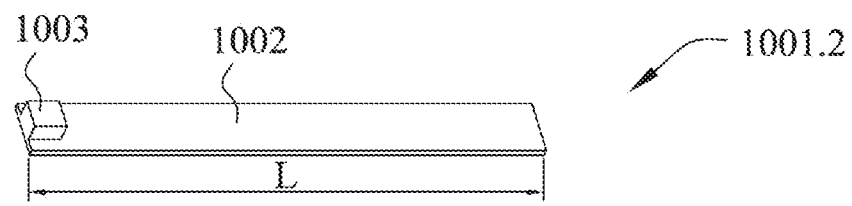
FIG. 11 shows a three-dimensional schematic view of a second manual slider 1001.2 in FIG. 9A.

FIG. 11 shows a three-dimensional schematic view of the second manual slider 1001.2 in FIG. 9A. The second manual slider 1001.2 comprises a bottom plate 1002 and a manual push part 1003, wherein the bottom plate 1002 takes the form of a plate in the form of a long strip, and the manual push part 1003 takes the form of a cuboid; the manual push part 1003 is disposed at the left end of the bottom plate 1002, thereby forming a protrusion on an upper surface of the bottom plate 1002, to facilitate pushing by an operator. The second manual slider 1001.2 has length L, and the length L is slightly greater than the length H of the second through-groove 1101.2, such that the second manual slider 1001.2 can completely occupy the length H of the second through-groove 1101.2.

Figure 12A:
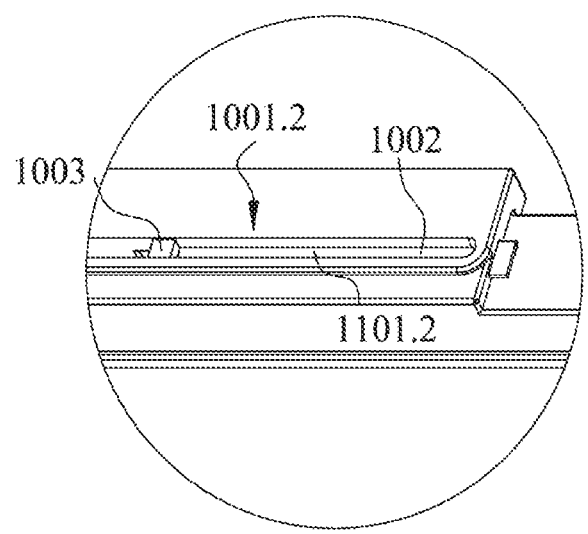
FIG. 12A shows an enlarged view of the vacuum wiper 306 shown in FIG. 9B at position D.
Figure 12B:
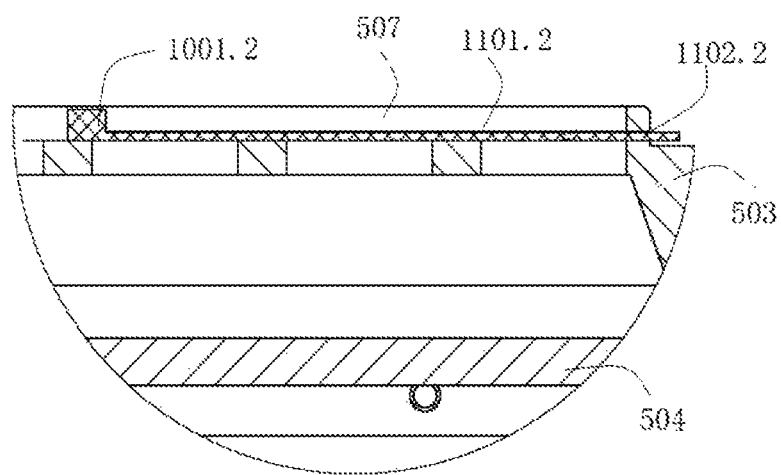
FIG. 12B shows a partial sectional view in direction E-E of the vacuum wiper 306 shown in FIG. 12A at position D.

FIG. 12A shows an enlarged view of the vacuum wiper 306 shown in FIG. 9B at position D; FIG. 12B shows a sectional view in direction E-E of the vacuum wiper 306 shown in FIG. 12A at position D. As shown in FIGS. 12A and 12B, the second manual slider 1001.2 is disposed on the second through-groove 1101.2 in such a way as to be slidable through the second slot 1102.2, and configured to cover the holes 502 at a right-side position of the vacuum wiper 306 from above. That end of the second manual slider 1001.2 which is provided with the manual push part 1003 is located on the inside of the vacuum wiper 306 in the length direction, such that the manual push part 1003 can be accommodated in the groove 508. An upper surface of the manual push part 1003 may be lower than the upper surface of the contact part 507, or flush with the upper surface of the contact part 507.

In order to adapt to the structure of the stencil printer 100, and match the wiping position of the stencil 118, the vacuum wiper 306 has a left-right symmetrical structure, and the operator needs to symmetrically push the first manual slider 1001.1 and the second manual slider 1001.2, in order to control the vacuumizing length of the vacuum wiper 306, and meet the length requirements of the PCB and stencil 118. Since the length H of the first through-groove 1101.1 and the second through-groove 1101.2 is slightly less than the length L of the manual sliders 1001, the first manual slider 1001.1 and the second manual slider 1001.2 are both limited at the left and right ends of the vacuum wiper 306. As the first manual slider 1001.1 and the second manual slider 1001.2 are sliding symmetrically, the first manual slider 1001.1 and the second manual slider 1001.2 can at all times cover the leftmost and rightmost holes 502 of the vacuum wiper 306 first, in order to ensure that the vacuumizing length of the vacuum wiper 306 is located at a middle position thereof at all times. When the operator pushes the first manual slider 1001.1 and the second manual slider 1001.2 to the leftmost side and rightmost side of the first through-groove 1101.1 and the second through-groove 1101.2, the manual push parts 1003 on the first manual slider 1001.1 and the second manual slider 1001.2 are blocked at edge positions at the left and right ends of the groove 508 respectively, at which time the vacuum wiper 306 has the maximum vacuumizing length Fmax. The maximum vacuumizing length Fmax is substantially equal to the length of the contact part 507.

Figure 13:
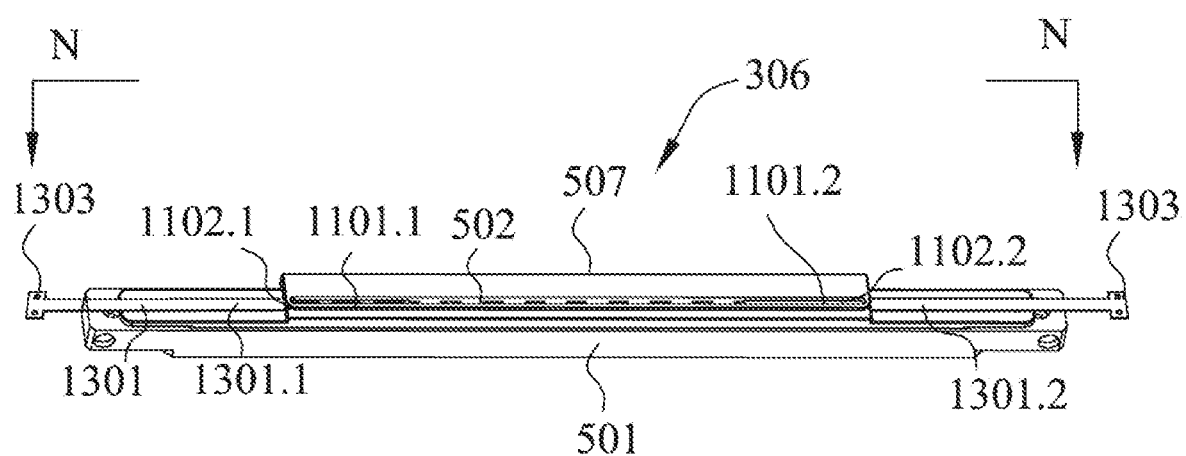
FIG. 13 shows a three-dimensional view of the vacuum wiper 306 in a third embodiment of the present application.

FIG. 13 shows a three-dimensional view of the vacuum wiper 306 in a third embodiment of the present application. The design principles and structure of the vacuum wiper 306 in the third embodiment of the present application are similar to the design principles and structure of the vacuum wiper 306 in the second embodiment shown in FIGS. 9A and 9B. Specifically, the housing 501 employed in the vacuum wiper 306 in the third embodiment has exactly the same structure as the housing 501 in the second embodiment; both comprise the first through-groove 1101.1 and the second through-groove 1101.2 for sliding a hole adjusting means. The difference is that the vacuum wiper 306 in the second embodiment uses the manual sliders 1001 as hole adjusting means, wherein the manual sliders 1001 can be manually driven directly by the operator, whereas the third embodiment uses electric sliders 1301 as hole adjusting means, wherein the electric sliders 1301 are driven by a drive apparatus 1501 (see FIG. 15). As shown in FIG. 13, the electric sliders 1301 comprises a first electric slider 1301.1 and a second electric slider 1301.2; the first electric slider 1301.1 and second electric slider 1301.2 have exactly the same structural shape, and are symmetrically disposed at two ends of the housing 501. The first electric slider 1301.1 is disposed on the first through-groove 1101.1 in such a way as to be slidable through the first slot 1102.1, and configured to cover the holes 502 at a left-side position of the vacuum wiper 306 from above; the second electric slider 1301.2 is disposed on the second through-groove 1101.2 in such a way as to be slidable through the second slot 1102.2, and configured to cover the holes 502 at a right-side position of the vacuum wiper 306 from above.

In order to adapt to the structure of the stencil printer 100, and match the wiping position of the stencil 118, the vacuum wiper 306 has a symmetrical structure, and the drive apparatus 1501 needs to subject the first electric slider 1301.1 and the second electric slider 1301.2 to a symmetrical operation. As the first electric slider 1301.1 and the second electric slider 1301.2 are sliding symmetrically, the first electric slider 1301.1 and the second electric slider 1301.2 can at all times cover the leftmost and rightmost holes 502 of the vacuum wiper 306 first, in order to ensure that the vacuumizing length of the vacuum wiper 306 is located at a middle position thereof at all times.

Figure 14:
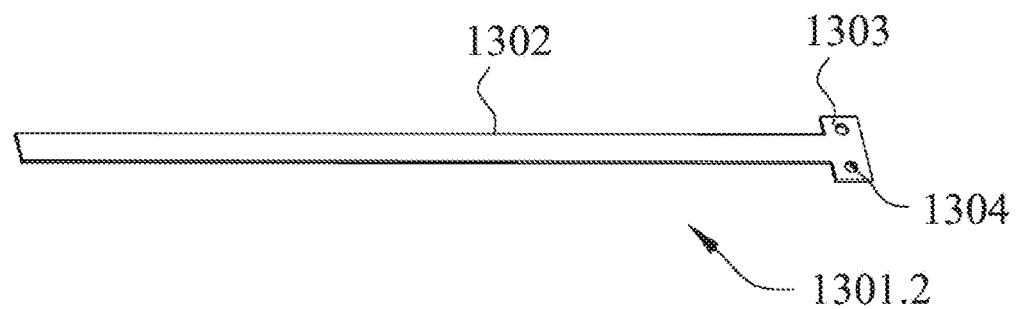
FIG. 14 shows a three-dimensional view of a second electric slider 1301.2 in FIG. 13.

FIG. 14 shows a three-dimensional view of the second electric slider 1301.2. The second electric slider 1301.2 comprises a slider body 1302 and a connecting component 1303; the connecting component 1303 is disposed at a right end of the slider body 1302. The slider body 1302 takes the form of a plate in the shape of a long strip; the connecting component 1303 has the same thickness as the slider body 1302, but is wider than the slider body 1302, such that two connecting holes 1304 can be disposed side by side in the width direction of the connecting component 1303. The connecting holes 1304 are used for connecting to the drive apparatus 1501 (see FIG. 15).

Figure 15:
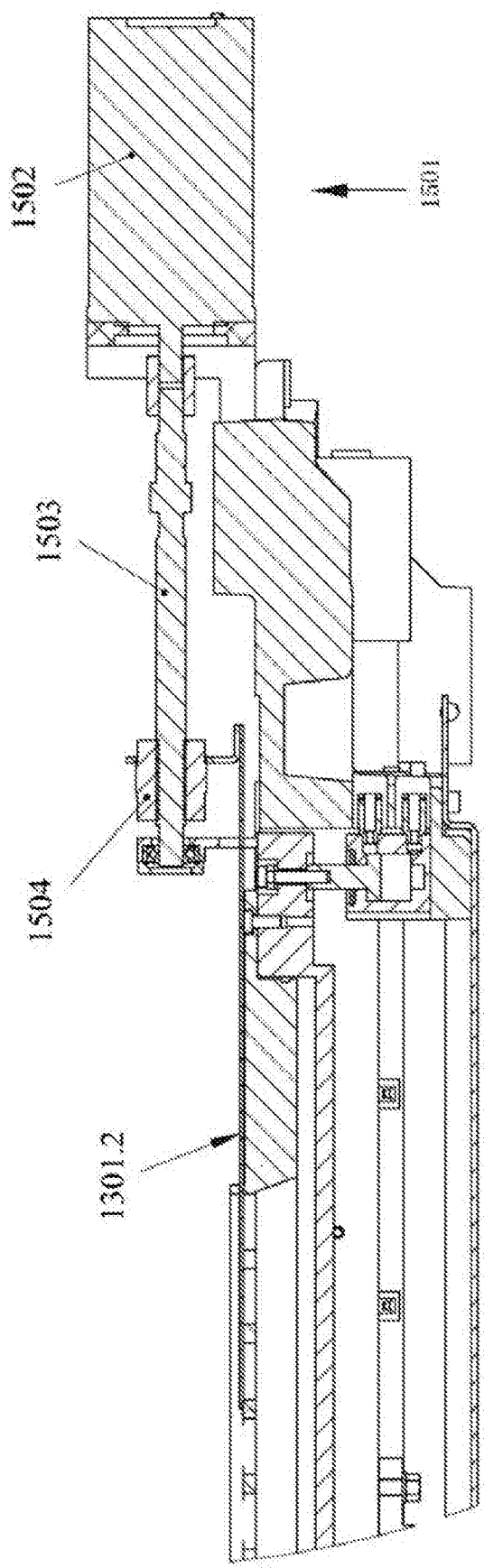
FIG. 15 shows a partial sectional view in direction N-N of the vacuum wiper 306 shown in FIG. 13 at the position of the second electric slider 1301.2.

FIG. 15 shows a sectional view in direction N-N of the vacuum wiper 306 shown in FIG. 13 at the position of the second electric slider 1301.2. Since the first electric slider 1301.1 and the second electric slider 1301.2 are arranged symmetrically, with symmetrical structures and exactly the same mechanism of action, the second electric slider 1301.2 is taken as an example for the purposes of description. As shown in FIG. 15, the connecting component 1303 of the second electric slider 1301.2 is connected to the drive apparatus 1501. The drive apparatus 1501 comprises an electric motor 1502, a screw 1503 and a nut 1504. The screw 1503 is connected to the electric motor 1502, and is thereby able to rotate together with the electric motor 1502 as the latter rotates; the nut 1504 is fitted and connected to the screw 1503, and is thereby able to move to the left or right in a straight line as the screw 1503 rotates. The nut 1504 is connected to the connecting component 1303 of the second electric slider 1301.2, and movement of the nut 1504 can drive the second electric slider 1301.2 to slide left or right on the second through-groove 1101.2. The operator can control a leftward or rightward sliding direction of the second electric slider 1301.2 by controlling a clockwise or anticlockwise rotation direction of the electric motor 1502.

When the first electric slider 1301.1 and the second electric slider 1301.2 enter the first through-groove 1101.1 and the second through-groove 1101.2 completely, thereby covering the holes 502 from above to the maximum extent, the vacuum wiper 306 has the minimum vacuumizing length Fmin. As the electric motor drives the first electric slider 1301.1 and the second electric slider 1301.2 to move towards the left side and right side of the first through-groove 1101.1 and the second through-groove 1101.2 respectively, the vacuum wiper 306 gradually extends its vacuumizing length F. When the electric motor drives the first electric slider 1301.1 and the second electric slider 1301.2 to move to the leftmost side and rightmost side of the first through-groove 1101.1 and the second through-groove 1101.2 respectively, the vacuum wiper 306 has the maximum vacuumizing length Fmax. The maximum vacuumizing length Fmax is substantially equal to the length of the contact part 507.

In the present application, the hole adjusting means is disposed on the vacuum wiping apparatus 306, such that the vacuum wiping apparatus 306 has an adjustable vacuumizing length, in order to match the wiping of stencils 118 with different length specifications, thereby effectively increasing the vacuumizing efficiency of the vacuum wiping apparatus 306 and reducing the production cost. It must be explained that the vacuum wiper 306 in the present application is applied in the stencil printer 100 in which solder paste is printed on PCBs; in other embodiments, the vacuum wiper 306 is also suitable for other applications in which other sticky materials (e.g. glue and sealant) need to be distributed.

Although only some features of the present application have been shown and described herein, many improvements and changes could be made by those skilled in the art. Thus, it should be understood that the attached claims are intended to encompass all of the abovementioned improvements and changes which fall within the scope of the essential spirit of the present application.

What is claimed is:

1. A vacuum wiper, comprising:
    a housing, containing a cavity;
    a connection port, the connection port being disposed on the housing and being in communication with the cavity;
    multiple holes, the multiple holes being disposed on the housing in a length direction of the housing, and the multiple holes being able to establish fluid communication between the cavity and an outside; the vacuum wiper having a maximum vacuumizing length when all of the multiple holes are in communication with the outside;
    a hole adjusting means, configured to be capable of blocking one or more of the multiple holes in sequence from two ends in the length direction of arrangement of the multiple holes of the vacuum wiper such that the vacuum wiper able to adjust the maximum vacuumizing length,
    wherein the hole adjusting means is two sliders, the two sliders being disposed at two sides in the length direction of the housing respectively, such that the two sliders are able to slidably block one or more of the multiple holes.

2. The vacuum wiper as claimed in claim 1, wherein the connection port is connectable to a vacuumizing apparatus.

3. The vacuum wiper as claimed in claim 1, wherein the hole adjusting means is multiple plugs, the size of each of the multiple plugs being matched to one corresponding hole of the multiple holes, thereby enabling said each plug to be at least partially plugged into one hole matched thereto.

4. The vacuum wiper as claimed in claim 3, wherein the multiple plugs are made of an elastic material.

5. The vacuum wiper as claimed in claim 4, wherein the multiple plugs are made of silicone rubber.

6. The vacuum wiper as claimed in claim 4, wherein each of the multiple plugs has a plug-in part and a handle part, the plug-in part and the handle part, being configured such that: when the plug is plugged into one hole matched thereto, the plug-in part enters the hole completely, and the handle part is retained outside the hole.

7. The vacuum wiper as claimed in claim 1, wherein each of the two sliders has a bottom plate and a manual push part, the bottom plate being configured to adjustably cover one or more of the multiple holes from above, and the manual push part being configured to facilitate manual adjustment by an operator, so as to control the number of blocked holes.

8. The vacuum wiper as claimed in claim 1, wherein one end of each of the two sliders is connected to an electric motor, such that the two sliders are both driven by the electric motor, in order to control the number of blocked holes.

9. The vacuum wiper as claimed in claim 1, wherein the vacuum wiper further comprises a through-groove, the through-groove being disposed on the housing, and the through-groove being located above the multiple holes, the through-groove being configured such that the two sliders are able to slide in the through-groove, and the two sliders are able to slidably cover the multiple holes from above.

10. A stencil printer, comprising:
    a support platform, for bearing a printed circuit board to be processed;
    the vacuum wiper as claimed in claim 1, the vacuum wiper being disposed at one side of the support platform;
    a stencil movably disposed above the support platform and the vacuum wiper, the stencil being used for distributing solder paste onto the printed circuit board;
    a winding roller wherein wiping paper or wiping cloth can be wound on the winding roller such that the wiping paper or wiping cloth is able to cover the multiple holes of the vacuum wiper from above;
    a vacuumizing apparatus connected to the connection port of the vacuum wiper and configured to vacuumize the cavity of the vacuum wiper, such that solder paste on the stencil can be adhesively sucked by the wiping paper or wiping cloth above the vacuum wiper.

11. A vacuum wiper, comprising:
    a housing, containing a cavity;

a connection port, the connection port being disposed on the housing and being in communication with the cavity;

multiple holes, the multiple holes being disposed on the housing in a length direction of the housing, and the multiple holes being able to establish fluid communication between the cavity and an outside; the vacuum wiper having a maximum vacuumizing length when all of the multiple holes are in communication with the outside;

a hole adjusting means, configured to be capable of blocking one or more of the multiple holes in sequence from two ends in the length direction of arrangement of the multiple holes of the vacuum wiper such that the vacuum wiper able to adjust the maximum vacuumizing length, wherein the hole adjusting means includes at least one slider extending in the length of direction of the housing, the at least one slider being configured to block one or more of the multiple holes.

12. The vacuum wiper of as claimed in claim 11, wherein the adjusting means includes two sliders, the two sliders being disposed at two sides in the length direction of the housing respectively, such that the two sliders are able to slidably block one or more of the multiple holes.

13. The vacuum wiper as claimed in claim 12, wherein each of the two sliders has a bottom plate and a manual push part, the bottom plate being configured to adjustably cover one or more of the multiple holes from above, and the manual push part being configured to facilitate manual adjustment by an operator, so as to control the number of blocked holes.

14. The vacuum wiper as claimed in claim 12, wherein one end of each of the two sliders is connected to an electric motor, such that the two sliders are both driven by the electric motor, in order to control the number of blocked holes.

15. The vacuum wiper as claimed in claim 12, wherein the vacuum wiper further comprises a through-groove, the through-groove being disposed on the housing, and the through-groove being located above the multiple holes, the through-groove being configured such that the two sliders are able to slide in the through-groove, and the two sliders are able to slidably cover the multiple holes from above.

16. The vacuum wiper as claimed in claim 11, wherein the hole adjusting means is multiple plugs, the size of each of the multiple plugs being matched to one corresponding hole of the multiple holes, thereby enabling said each plug to be at least partially plugged into one hole matched thereto.

17. The vacuum wiper as claimed in claim 16, wherein the multiple plugs are made of an elastic material.

18. The vacuum wiper as claimed in claim 17, wherein the multiple plugs are made of silicone rubber.

19. The vacuum wiper as claimed in claim 17, wherein each of the multiple plugs has a plug-in part and a handle part, the plug-in part and the handle part, being configured such that: when the plug is plugged into one hole matched thereto, the plug-in part enters the hole completely, and the handle part is retained outside the hole.

* * * * *